(12) United States Patent
Tsai et al.

(10) Patent No.: US 8,455,859 B2
(45) Date of Patent: Jun. 4, 2013

(54) STRAINED STRUCTURE OF SEMICONDUCTOR DEVICE

(75) Inventors: Ming-Huan Tsai, Hsinchu (TW); Han-Ting Tsai, Kao Hsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 373 days.

(21) Appl. No.: 12/571,604

(22) Filed: Oct. 1, 2009

(65) Prior Publication Data

US 2011/0079856 A1 Apr. 7, 2011

(51) Int. Cl.
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |

(52) U.S. Cl.
USPC .............................................. 257/19; 257/65

(58) Field of Classification Search
USPC ...................................... 257/19, 65
See application file for complete search history.

(56) References Cited

U.S. PATENT DOCUMENTS

| 7,195,985 | B2 | 3/2007 | Murthy et al. |
| 2005/0148147 | A1 | 7/2005 | Keating et al. |
| 2006/0138398 | A1* | 6/2006 | Shimamune et al. ........... 257/19 |
| 2007/0249168 | A1 | 10/2007 | Rotondaro et al. |
| 2007/0281493 | A1 | 12/2007 | Fucsko et al. |
| 2008/0001182 | A1 | 1/2008 | Chen et al. |
| 2011/0024801 | A1* | 2/2011 | Cheng et al. .................. 257/255 |

* cited by examiner

*Primary Examiner* — Thien F Tran
(74) *Attorney, Agent, or Firm* — Haynes and Boone, LLP

(57) ABSTRACT

The present disclosure provides a semiconductor device that includes a semiconductor substrate, a gate structure disposed on a surface of the substrate, and strained structures disposed in the substrate at either side of the gate structure and formed of a semiconductor material different from the semiconductor substrate. Each strained structure has a cross-sectional profile that includes a first portion that extends from the surface of substrate and a second portion that tapers from the first portion at an angle ranging from about 50° to about 70°. The angle is measured with respect to an axis parallel to the surface of the substrate.

19 Claims, 16 Drawing Sheets

US 8,455,859 B2

STRAINED STRUCTURE OF SEMICONDUCTOR DEVICE

BACKGROUND

When a semiconductor device such as a metal-oxide-semiconductor field-effect transistors (MOSFETs) is scaled down through various technology nodes, high k dielectric material and metal are adopted to form a gate stack. In addition, strained structures utilizing epitaxy silicon germanium (SiGe) may be used to enhance carrier mobility. However, current techniques to form these strained structures have not been satisfactory in all respects. For example, these strained structures may not produce sufficient stress in a channel region to improve a saturation drain current of the device.

SUMMARY

One of the broader forms of an embodiment of the present invention involves a semiconductor device. The semiconductor device includes a semiconductor substrate; a gate structure disposed on a surface of the substrate; and strained structures disposed in the substrate at either side of the gate structure and formed of a semiconductor material different from the semiconductor substrate, each strained structure having a cross-sectional profile that includes a first portion that extends from the surface of substrate and a second portion that extends from the first portion at an angle ranging from about 50° to about 70°, the angle being measured with respect to an axis parallel to the surface of the substrate.

Another one of the broader forms of an embodiment of the present invention involves a semiconductor device. The semiconductor device includes a semiconductor substrate having a first region and a second region; an NMOS transistor disposed in the first region of the substrate; and a PMOS transistor disposed in the second region of the substrate. The PMOS transistor includes a gate structure disposed over a channel region of the substrate; spacers disposed on sidewalls of the gate structure; and strained source and drain regions disposed in the substrate at either side of the gate structure, the strained source and drain regions each having an upper portion that is spaced a distance ranging from 1 nm to about 5 nm away from the channel region and a lower portion that tapers away from the upper portion at an angle ranging from about 50° to about 70°, the angle being measured with respect to an axis parallel to a surface of the substrate.

Yet another one of the broader forms of an embodiment of the present invention involves a semiconductor device. The semiconductor device includes a semiconductor substrate having a surface; a gate structure disposed on the surface of the substrate; a spacer disposed on a sidewall of the gate structure; and a strained feature disposed in the substrate and formed of a material different from the semiconductor substrate, the strained feature including a vertical section that directly underlies the spacer and a tapered section that tapers from the vertical section in a direction away from the surface of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
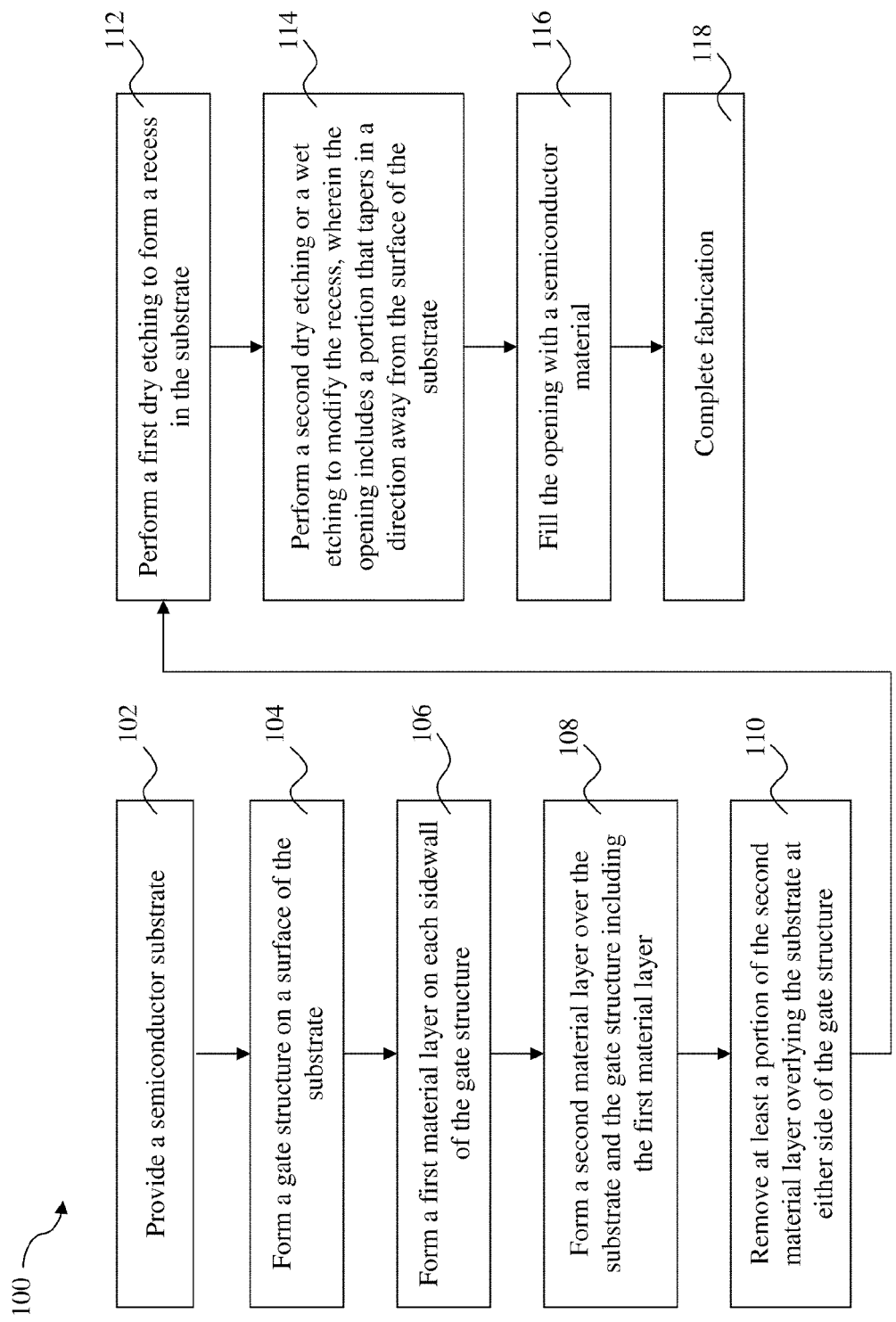
FIG. 1 is a flow chart of a method of fabricating a semiconductor device having strained features according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart of a method 100 of fabricating a semiconductor device according to various aspects of the present disclosure. The method 100 begins with block 102 in which a semiconductor substrate is provided. The method 100 continues with block 104 in which a gate structure is formed on a surface of the substrate. The method 100 continues with block 106 in which a first material is formed on each sidewall of the gate structure. The method continues with block 108 in which a second material layer is formed over the substrate and the gate structure including the first material layer. The method 100 continues with block 110 in which at least a portion of the second material layer overlying the substrate at either side of the gate structure is removed.

The method 100 continues with block 112 in which a first dry etching is performed to form an recess in the substrate. The method 100 continues with block 114 in which a first dry etching and a wet etching is performed to modify the recess. The recess includes a portion that tapers in a direction away from the surface of the substrate. The method 100 continues with block 116 in which the recess is filled with a semiconductor material. The method 100 continues with block 118 in which fabrication of the semiconductor device is completed. The discussion that follows illustrates various embodiments of a semiconductor device that can be fabricated according to the method 100 of FIG. 1.

Figure 2A:
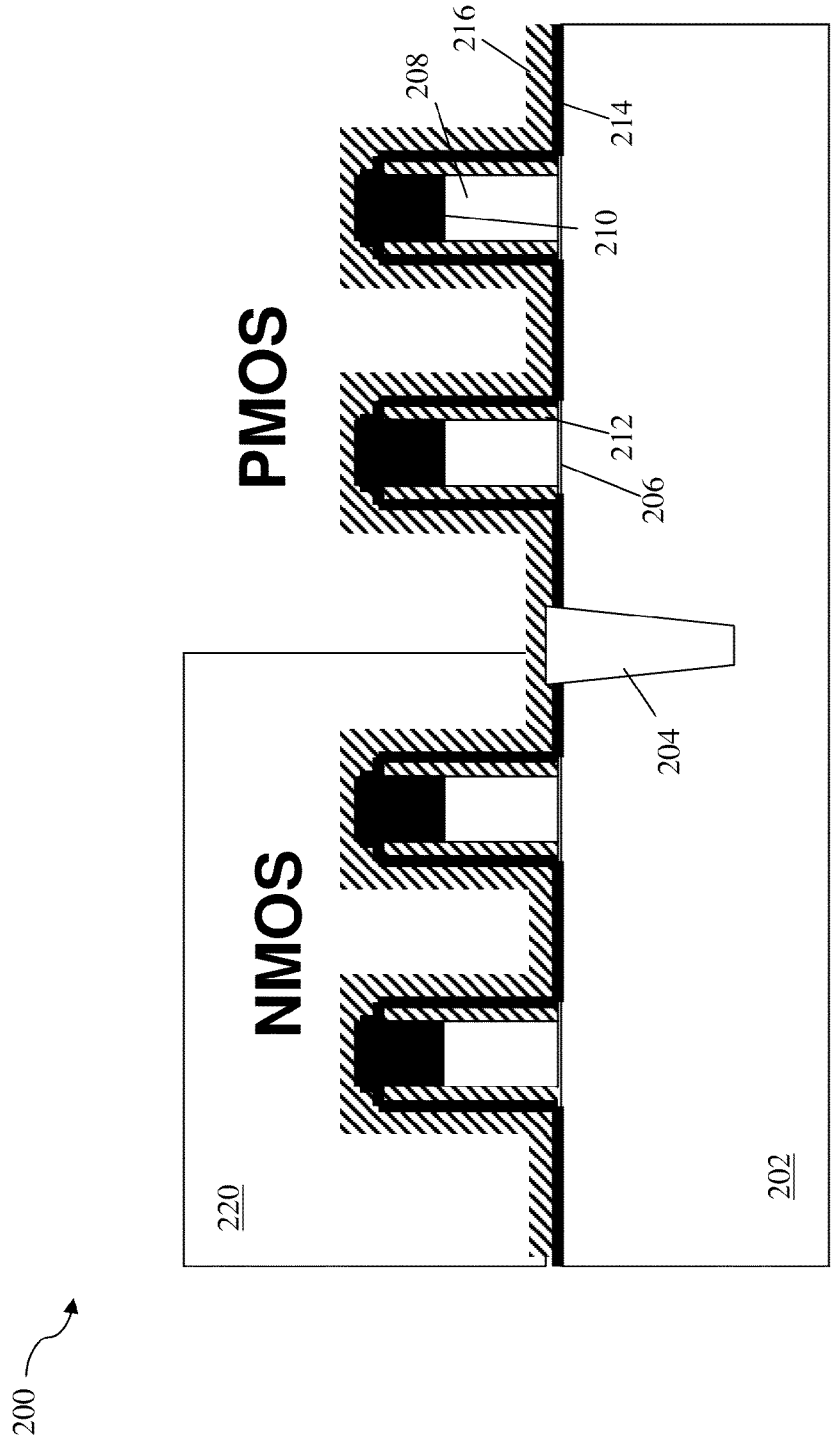
FIGS. 2A-2G are cross-sectional views of an embodiment of a semiconductor device at various stages of fabrication according to the method of FIG. 1.

Referring to FIGS. 2A-2G, illustrated is an embodiment of a semiconductor device 200 at various stages of fabrication according to the method 100 of FIG. 1. It is understood that FIGS. 2A-2G have been simplified for the sake of clarity to better understand the inventive concepts of the present disclosure. In FIG. 2A, the semiconductor device 200 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX) technology, wafer bonding, selective epitaxial growth (SEG), or other proper method. The semiconductor device 200 includes active regions defined in the substrate 202.

Various shallow trench isolation (STI) structures 204 are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor field-effect transistors (NMOS and PMOS). The operational devices are configured as an array of NMOS devices and an array of PMOS devices. The NMOS and PMOS devices may be fabricated by CMOS technology processing. Accordingly, it is understood that additional processes may be provided before, during, and after the method 100 of FIG. 1, and that some other processes may only be briefly described herein. Each NMOS and PMOS device includes a gate structure formed on the semiconductor substrate 202. The gate structure includes a gate dielectric 206 and a gate electrode. The gate dielectric 206 may include silicon oxide, silicon nitride, high-k dielectric, or other suitable material. The high-k dielectric layer may include a binary or ternary high-k film such as HfOx. Alternatively, the high-k dielectric layer 216 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba, Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

The gate electrode 208 may include polysilicon (or poly). For example, silane (SiH4) may be used as a chemical gas in a CVD process to form the poly. The poly layer may include a thickness ranging from about 400 to about 800 Angstrom (A). The gate structure may further include a hard mask layer 210 formed on the gate electrode 208. The hard mask layer 210 include silicon oxide. Alternatively, the hard mask layer 210 may optionally silicon nitride, silicon oxynitride, and/or other suitable dielectric materials, and may be formed using a method such as CVD or PVD. The hard mask layer 210 may include a thickness ranging from about 100 to about 400 Angstrom (A).

The semiconductor device 200 includes an offset spacer 212 formed on each sidewall of the gate structures. The offset spacer 212 includes silicon nitride and has a thickness ranging from about 4 to about 6 nm. In the present embodiment, the offset spacer 212 has a thickness of about 5.5 nm. The offset spacer 212 may be formed by CVD, PVD, ALD, plasma enhanced CVD (PECVD), or other suitable technique. An ion implantation process may be performed to form lightly doped source/drain regions (LDD) in the substrate 202. The LDD regions are aligned with the offset spacer 212. The ion implantation process may utilize p-type dopants (e.g., B or In) for the PMOS devices and n-type dopants (P or As) for the NMOS devices.

The semiconductor device 200 further includes an pad oxide layer 214 formed over the substrate 202 and the gate structures. The pad layer may be formed by CVD, PVD, ALD, or other suitable technique. The pad oxide layer 214 includes a thickness ranging from about 2 to about 4 nm. In the present embodiment, the pad oxide layer 214 has a thickness of about 2 nm. The semiconductor device 200 further includes a cap layer 216 formed over the pad oxide layer. The cap layer 216 may be formed of silicon nitride. The cap layer 216 may be formed by CVD, PVD, ALD, or other suitable technique. The cap layer 216 includes a thickness ranging from about 10 to about 15 nm. In the present embodiment, the cap layer 216 has a thickness of about 10 nm. It should be noted that the pad oxide layer 214 may be omitted in some embodiments as will be explained later.

A patterned photoresist layer 220 is formed to protect the NMOS devices. The patterned photoresist layer 220 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint.

Figure 2B:
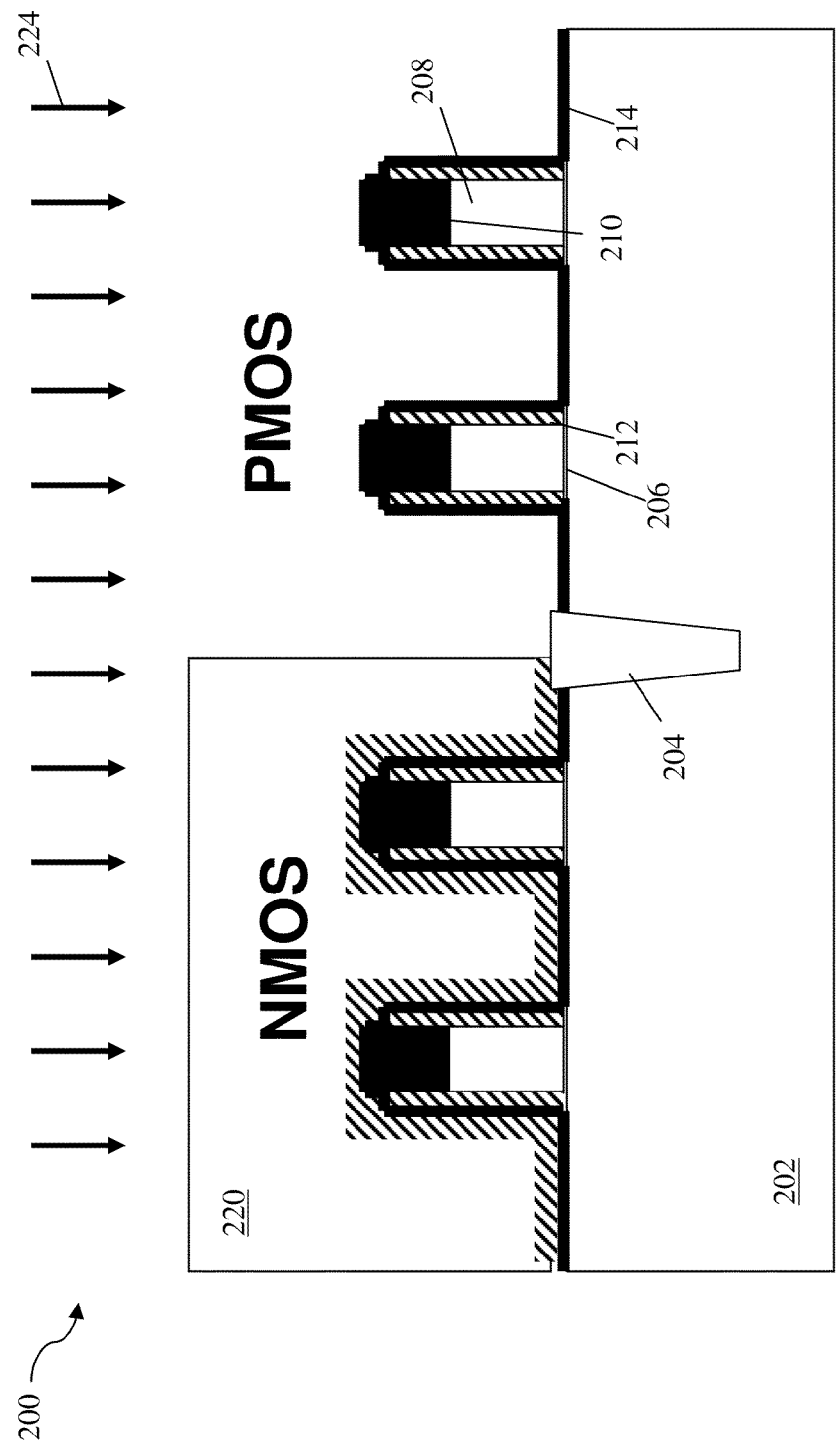

In FIG. 2B, an etching process 224 is performed to remove the cap layer 216 overlying the PMOS devices. In the present embodiment, the etching process 224 includes a dry etching process that utilizes a gas combination of CHxFy/O2 or SF6/CHxFy/He (where x=1 to 3 and y=4−x). With respect to the gas combination of CHxFy/O2, the dry etching process utilizes a pressure ranging from about 1 mT to about 1000 mT, a power ranging from about 500 W to about 3000 W, a bias voltage ranging from about 100 V to about 500 V, a CHxFy flow rate ranging from about 10 sccm to about 500 sccm, and an O2 flow rate ranging from about 10 sccm to about 500 sccm. With respect to the gas combination of SF6/CHxFy/He, the dry etching process utilizes a pressure ranging from about 1 mT to about 1000 mT, a power ranging from about 500 W to about 3000 W, a bias voltage ranging from about 0 V to about 200 V, a SF6 flow rate ranging from about 10 sccm to about 100 sccm, a CHxFy flow rate ranging from about 10 sccm to about 500 sccm, and an He flow rate ranging from about 10 sccm to about 1000 sccm. The dry etching process may be performed for about 40 seconds to remove the 10 nm thick cap layer 216 of silicon nitride. In other embodiments, the etching process 224 may optionally include a wet etching that has a high selectively of silicon nitride to silicon oxide.

Figure 2C:
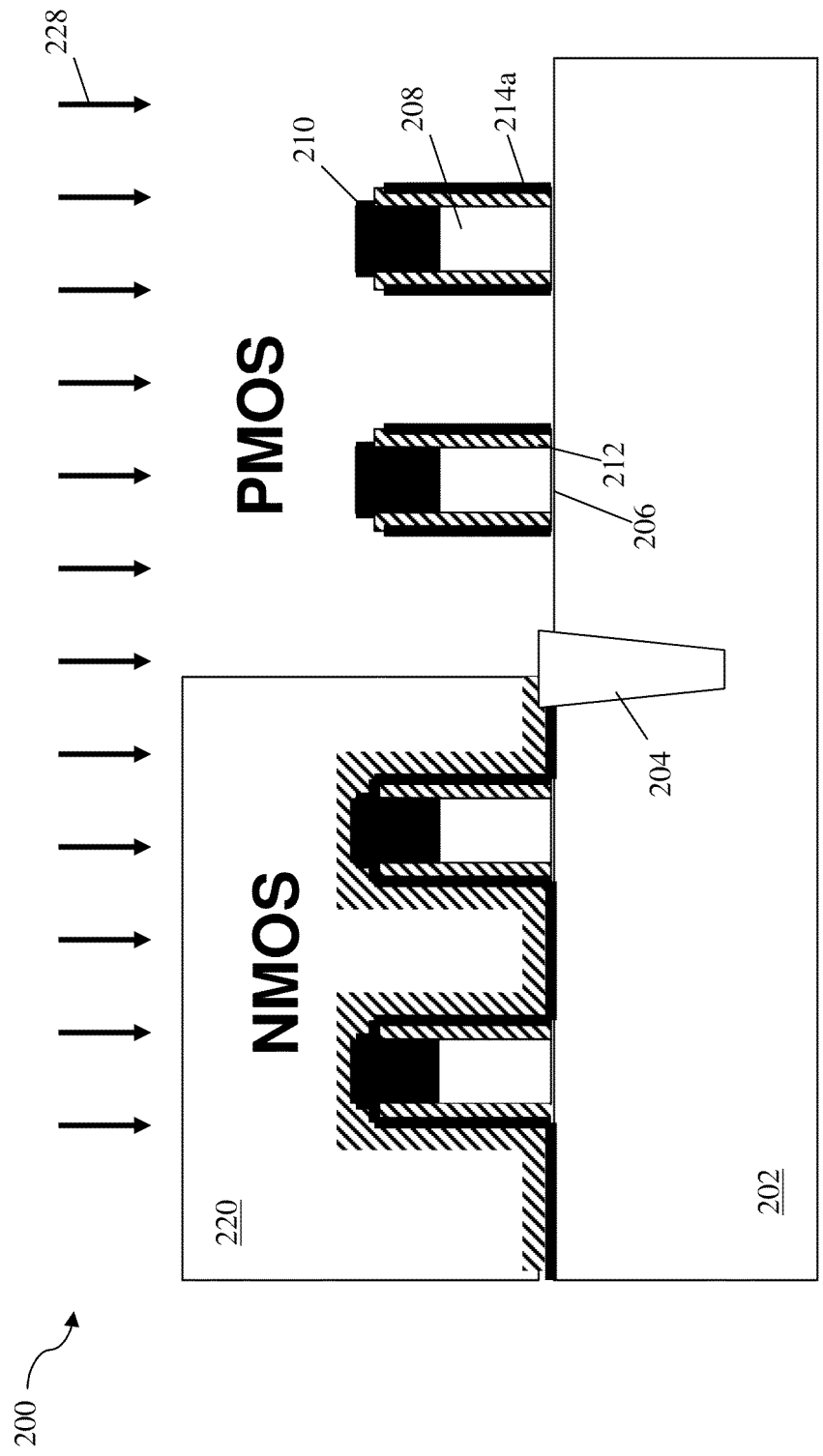

In FIG. 2C, an etching process 228 is performed to break through the pad oxide 214 directly overlying the substrate 202. The etching process 228 includes a dry etching process that utilizes a gas combination of CF4/Cl2/HBr/He, a pressure ranging from about 1 mT to about 1000 mT, a power ranging from about 50 W to about 500 W, a bias voltage ranging from about 10 V to about 500 V, a CF4 flow rate ranging from about 10 sccm to about 500 sccm, a Cl2 flow rate ranging from about 0 sccm to about 200 sccm, an HBr flow rate ranging from about 0 sccm to about 200 sccm, and an He flow rate ranging from about 0 sccm to about 1000 sccm. The dry etching removes portions of the pad oxide 214 overlying the substrate 202. The dry etching may be performed for about 9 seconds to break through the pad oxide 214. However, this time period is insufficient to remove the pad oxide disposed on the offset spacer 212. Therefore, following the etching process 228, a pad oxide 214a and the offset spacer 212 having a combined thickness of about 7.5 to about 8 nm remain of the sidewalls of the gate structures of the PMOS devices.

As previously noted, in some other embodiments, the pad oxide 214 may be omitted. Accordingly, the cap layer of silicon nitride is formed on the offset spacer. A dry etching may be performed to anisotropically etch the cap layer such that a portion of the cap layer directly overlying the substrate is removed but another portion of the cap layer remains on the offset spacer. The dry etching may be tuned such that the resulting dummy spacer of silicon nitride (e.g., cap layer and offset spacer) is about 7.5 to about 8 nm thick (similar thickness when utilizing the pad oxide). In other embodiments, the resulting dummy spacer of silicon nitride may be thinner so that the opening can be formed closer to the channel region.

Figure 2D:
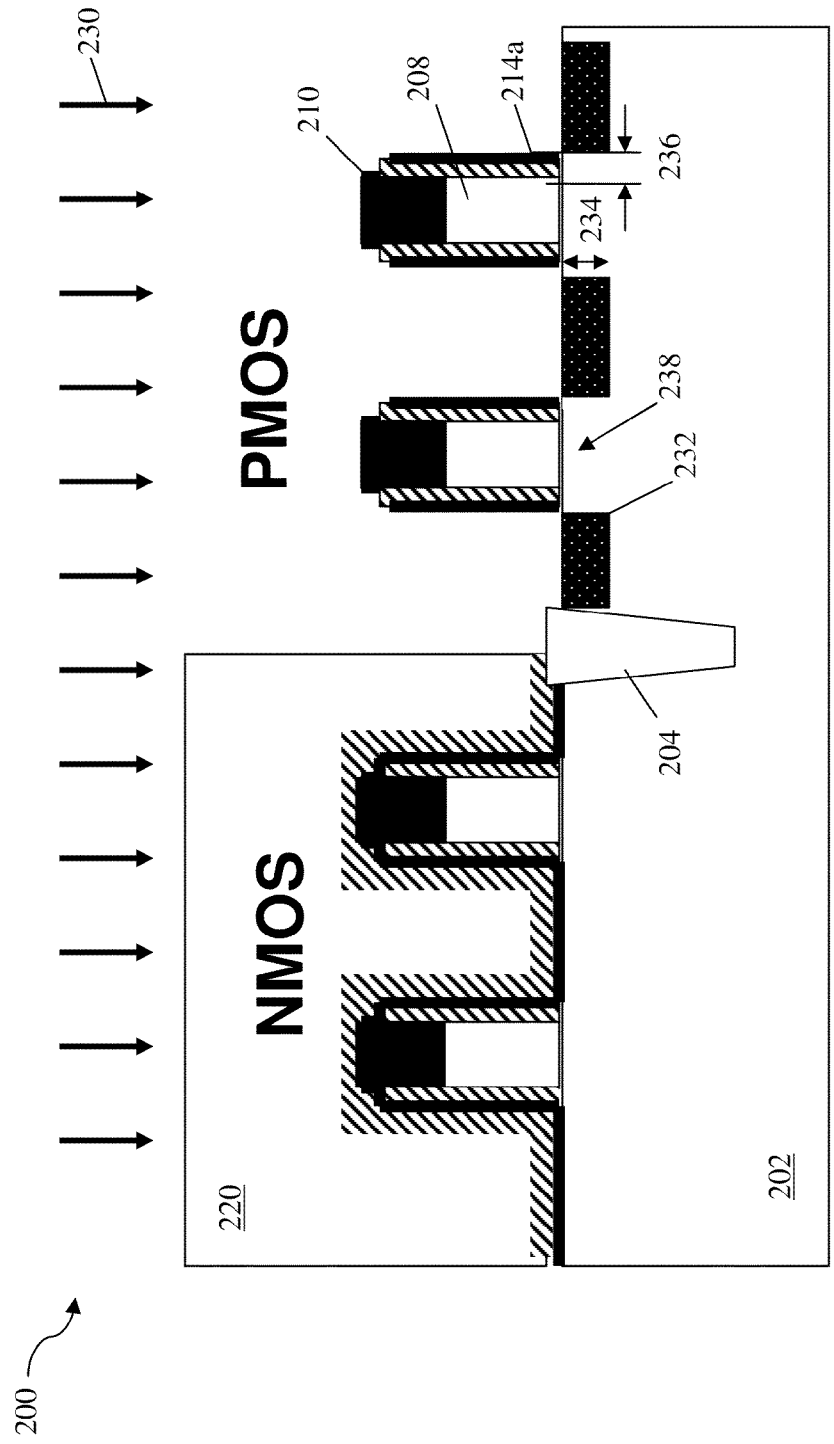

In FIG. 2D, an etching process 230 is performed to etch a recess or opening 232 in the substrate 202. The etching process 230 includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate that are unprotected or exposed. It is noted that the pad oxide 214a and hard mask 210 protect the gate structure of the PMOS device during the dry etching process. The dry etching process allows better control of an etching direction to achieve of a particular shape. Accordingly, the recess 232 has vertical sidewalls that are aligned with the pad oxide 214a due to the directional/anisotropic etching. The recess 232 may have a depth 234 ranging from about 100 to about 250 Angstrom. In the present embodiment, the recess has a depth 234 of about 200 Angstrom. Additionally, a proximity of the recess 232 to a channel region 238 may be limited by the thickness of the offset spacer 212 and pad oxide 214 disposed on the sidewall of the gate structure. In some embodiments, a proximity of the subsequently formed strained feature can be reduce by performing a dilute HF wet etching to remove the pad oxide before etching the recess. In the present embodiment, the recess 232 is spaced a distance 236 of about 4 to about 5 nm.

Figure 2E:
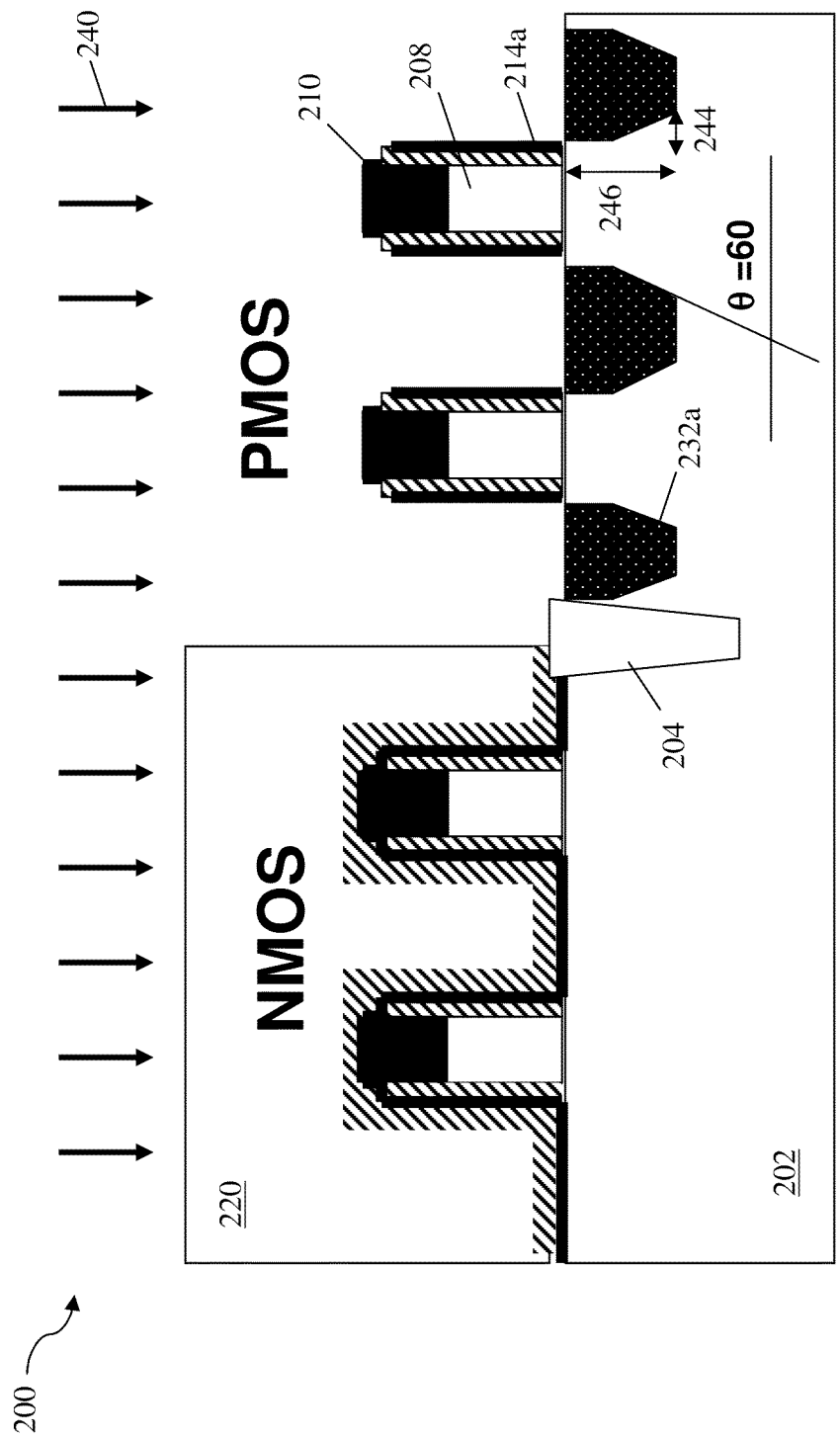

In FIG. 2E, an etching process 240 is performed to modify the recess 232 in the substrate. The etching process 240 includes a dry etching process that utilizes a combination of HBr/O2/He, a pressure ranging from about 1 mT to about 1000 mT, a power ranging from about 50 W to about 1000 W, a bias voltage ranging from about 10 V to about 100 V, an HBr flow rate ranging from about 10 sccm to about 500 sccm, an O2 flow rate ranging from about 0 sccm to about 100 sccm, and an He flow rate ranging from about 0 sccm to about 1000 sccm. The dry etching process is tuned so that there is a tapered etching in a direction away from the surface of the substrate 202. In some embodiments, a bias voltage may be tuned to achieve the tapered sidewall. The recess 232a may include tapered sidewalls that have an angle θ ranging from about 50° to about 70°. In the present embodiment, the recess 232a includes sidewalls that are tapered at an angle θ of about 60°. It is noted that the angle θ is measured with respect to an axis that is parallel to the surface of the substrate 202. Also, the tapered portion of the recess 232a tapers a distance 244 of about 4 nm from the vertical side of the recess. Further, the recess 232a includes an overall depth 246 ranging from about 500 Angstrom to about 600 Angstrom.

Figure 2F:
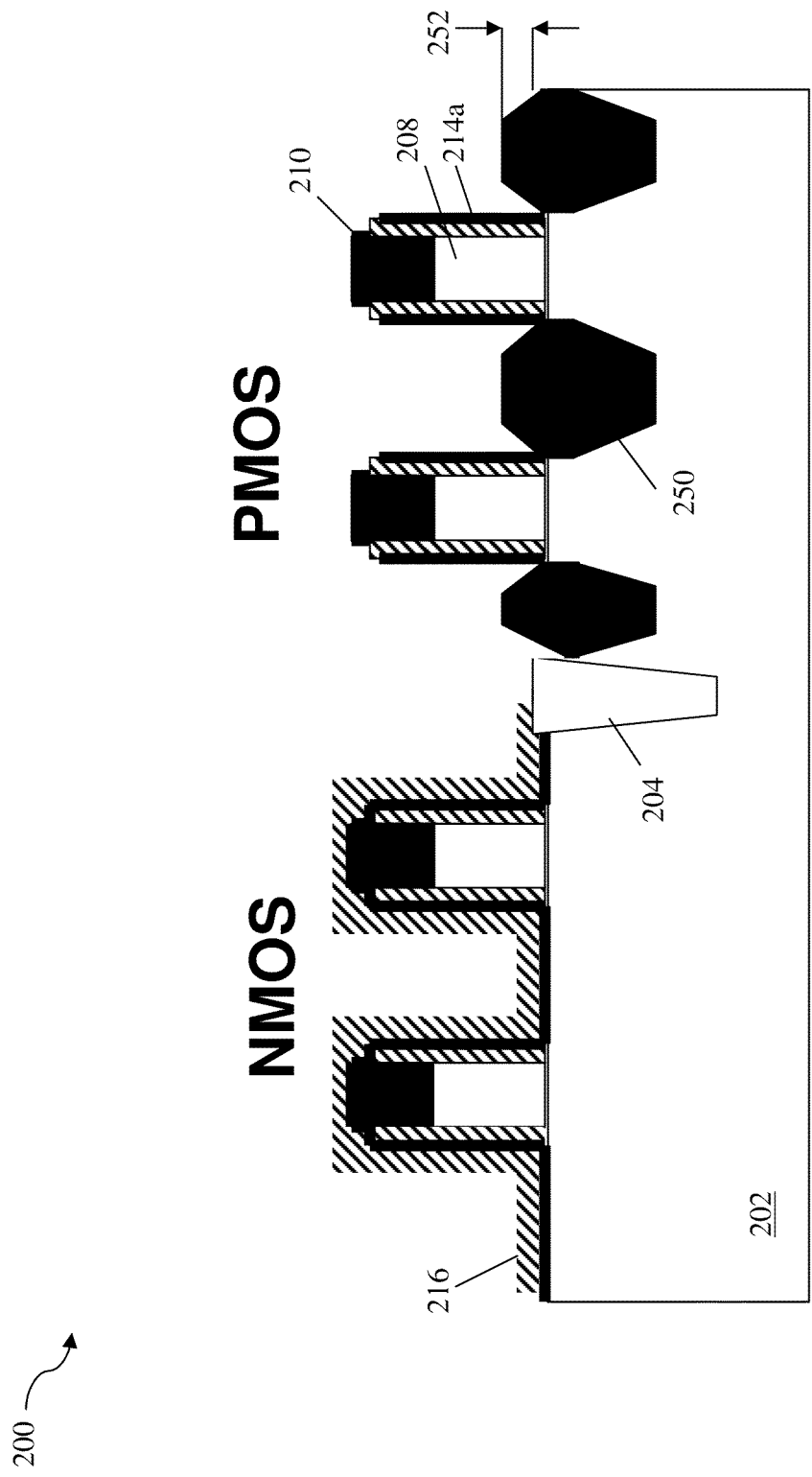

In FIG. 2F, an epitaxy process is performed to deposit a semiconductor material in the recess 232a. The semiconductor material is different from the substrate. Accordingly, the channel region is strained or stressed to enable carrier mobility of the device and enhance the device performance. The patterned photoresist 220 protecting the NMOS devices is removed prior to the epi process. A pre-cleaning process may be performed to clean the recess 232a with HF or other suitable solution. In the present embodiment, silicon germanium (SiGe) 250 is deposited by an epitaxy (epi) process on the substrate 202 to form the source and drain regions. It is noted that the SiGe 250 does not accumulate on the hard mask 210, the pad oxide 214a, the cap layer 216, and the isolation structure 204. Additionally, the SiGe 250 is deposited such that it is raised a distance 252 of about 125 Angstrom above the surface of the substrate 202. In furtherance of the present embodiment, the SiGe 250 may be in-situ doped with p-type impurities, such as B or In, to form source/drain regions of the PMOS devices.

It has been observed that formation of the SiGe 250 structure in closer proximity to the channel region near the surface of the substrate provides more stress and strain, and thus carrier mobility is enhanced. Accordingly, a saturation drain current of the device can be improved by 10 to 20% over current techniques that form the strained structures. Further, the etching processes discussed above allow a better process margin to control the proximity of the SiGe 250 structure from the channel region. Additionally, the SiGe 250 structure does not suffer from short channel penalty such as drain induced barrier lowering (DIBL) due to SiGe proximity pull back (from the region of the substrate directly under the gate structure) with respect to the vertical and tapered sidewalls of the SiGe structure. This is even so even as device features shrink and the channel length becomes smaller in advanced technology processes (e.g., 32 nm and below).

Figure 2G:
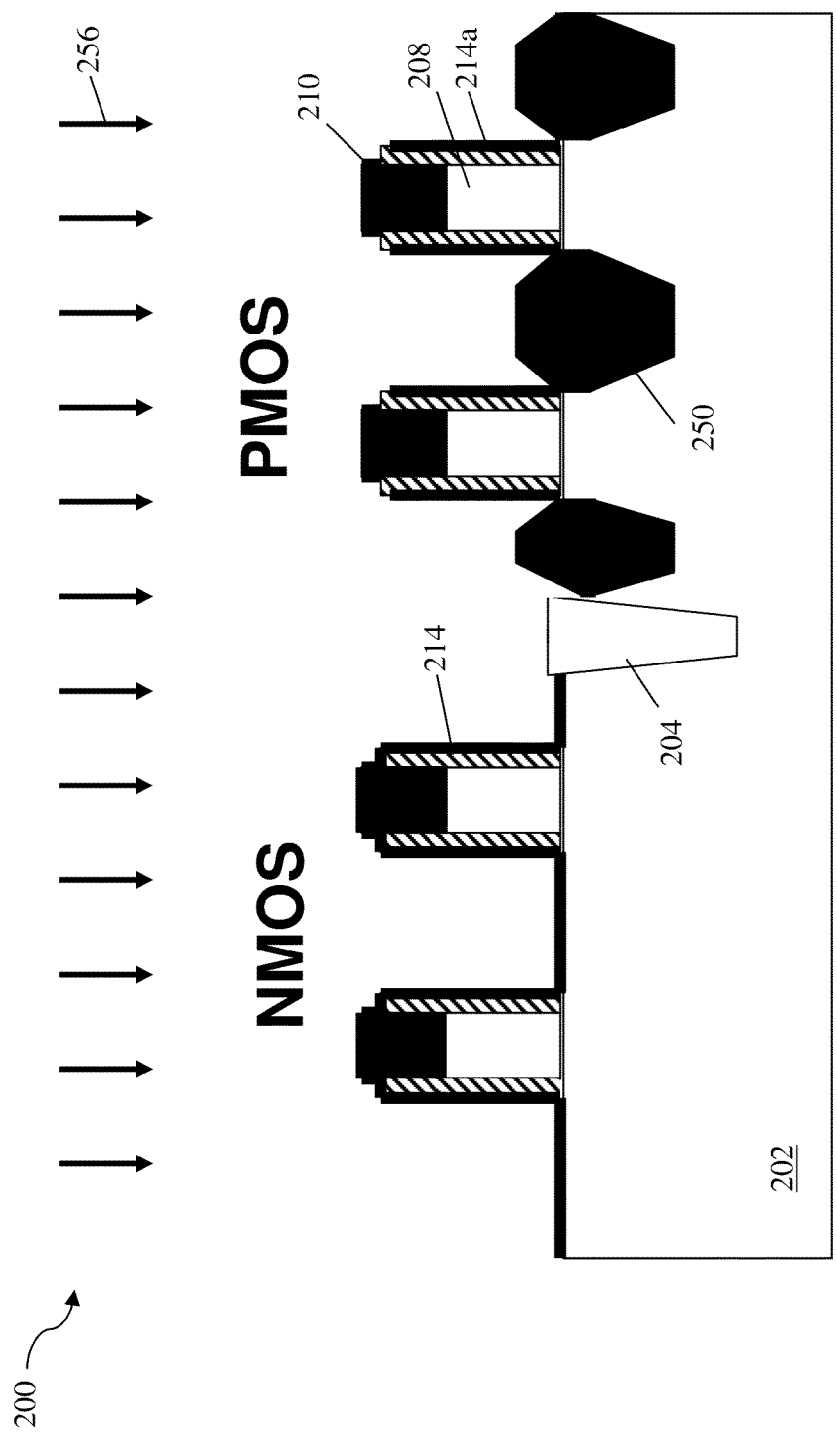

In FIG. 2G, an etching process 256 is performed to remove the cap layer 216 overlying the NMOS devices. The etching process 256 includes a wet etching utilizing H3PO4 or other suitable etchant. The wet etching is selected so that a slow etch rate is achieved to protect the poly. The semiconductor device 200 continues with processing to complete fabrication as discussed briefly below. For example, source/drain regions for the NMOS device may be formed by ion implantation of n-type dopants such as P or As. In another embodiment, silicon carbide (SiC) may be deposited by an epitaxy process in the silicon substrate to form the source/drain regions of the NMOS devices in a similar manner as described above. Additionally, silicide features are formed on the raised source/drain features to reduce the contact resistance. The silicide can be formed on the sources/drains by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to polish the substrate. In another example, an contact etch stop layer (CESL) is formed on top of the gate structures before forming the ILD layer. In an embodiment, the gate electrode 208 remains poly in the final device. In another embodiment, the poly is removed and replaced with a metal in a gate last or gate replacement process. In a gate last process, the CMP process on the ILD layer is continued until the poly surface is exposed, and an etching process is performed to remove the poly thereby forming trenches. The trenches are filled with a proper work function metal (e.g., p-type work function metal and n-type work function metal) in the PMOS devices and the NMOS device. A multilayer interconnection (MLI) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

Figure 3A:
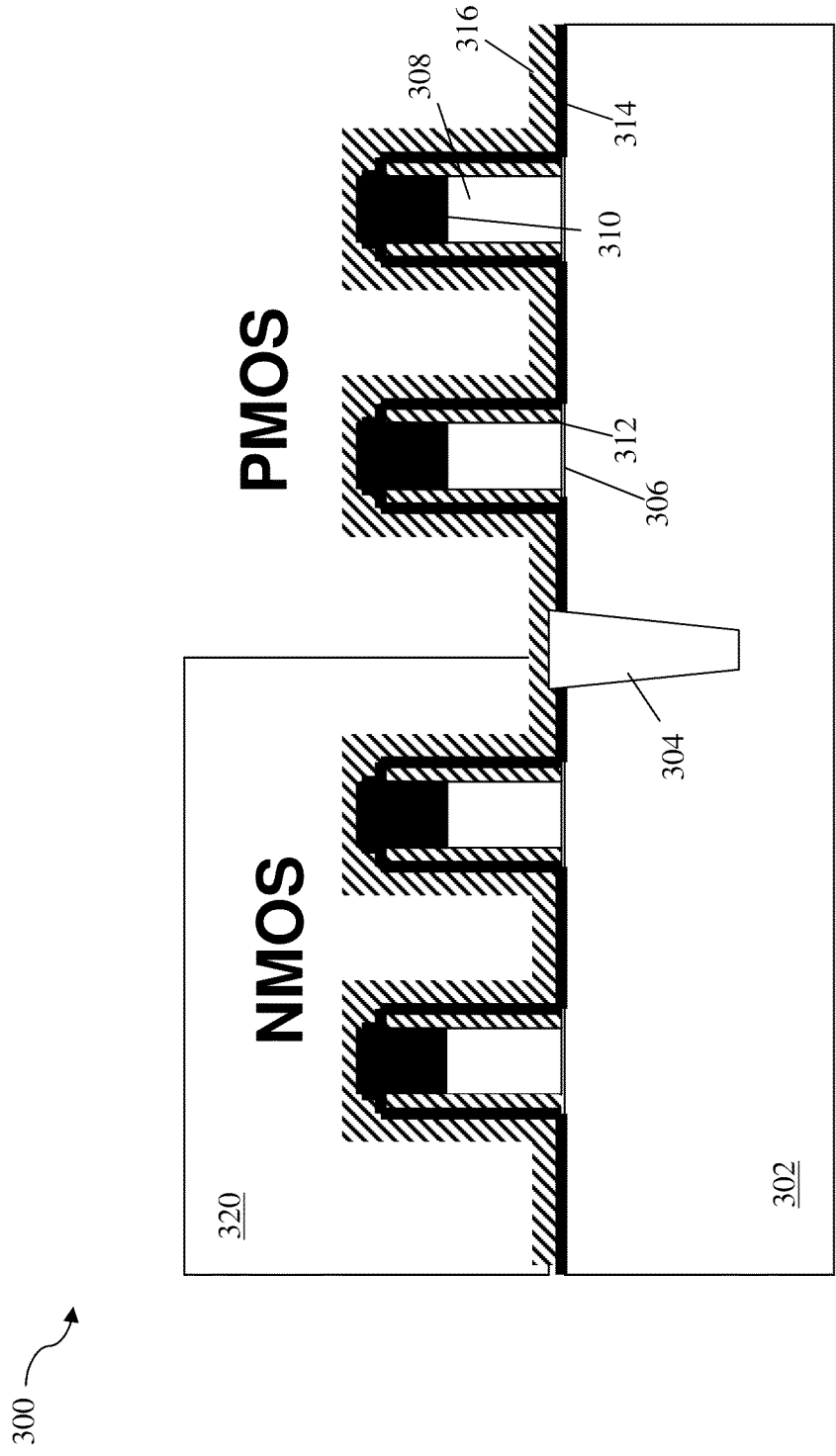
FIGS. 3A-3H are cross-sectional views of another embodiment of a semiconductor device at various stages of fabrication according to the method of FIG. 1.

Referring to FIGS. 3A-3H, illustrated is an embodiment of a semiconductor device 300 at various stages of fabrication according to the method 100 of FIG. 1. It is understood that FIGS. 3A-3H have been simplified for the sake of clarity to better understand the inventive concepts of the present disclosure. In FIG. 3A, the semiconductor device 300 includes a substrate 302 similar to the substrate 202 of FIG. 2.

Various shallow trench isolation (STI) structures 304 are formed in the semiconductor substrate for isolating the various active regions. One or more operational devices are formed in the active regions. The operational devices include n-type and p-type metal-oxide-semiconductor field-effect transistors (NMOS and PMOS). The operational devices are configured as an array of NMOS devices and an array of PMOS devices. The NMOS and PMOS devices may be similar to the ones discussed above with reference to FIG. 2.

Each NMOS and PMOS device includes a gate structure formed on the semiconductor substrate 302. The gate structure includes a gate dielectric 306 and a gate electrode. The gate dielectric 306 may include silicon oxide, silicon nitride, high-k dielectric, or other suitable material. The gate electrode 308 may include polysilicon (or poly). For example, silane ($SiH_4$) may be used as a chemical gas in a CVD process to form the poly. The poly layer may include a thickness ranging from about 400 to about 800 Angstrom. The gate structure may further include a hard mask layer 310 formed on the gate electrode 308. The hard mask layer 310 include silicon oxide. Alternatively, the hard mask layer 310 may optionally silicon nitride, silicon oxynitride, and/or other suitable dielectric materials, and may be formed using a method such as CVD or PVD. The hard mask layer 310 may include a thickness ranging from about 100 to about 400 Angstrom.

The semiconductor device 300 includes an offset spacer 312 formed on each sidewall of the gate structures. The offset spacer 312 includes silicon nitride and has a thickness ranging from about 4 to about 6 nm. In the present embodiment, the offset spacer 312 has a thickness of about 5 nm. The offset spacer 312 may be formed by CVD, PVD, ALD, plasma enhanced CVD (PECVD), or other suitable technique. An ion implantation process may be performed to form lightly doped source/drain regions (LDD) in the substrate 302. The LDD regions are aligned with the offset spacer 312. The ion implantation process may utilize p-type dopants (e.g., B or In) for the PMOS devices and n-type dopants (P or As) for the NMOS devices.

The semiconductor device 300 further includes an pad oxide layer 314 formed over the substrate 302 and the gate structures. The pad layer may be formed by CVD, PVD, ALD, or other suitable technique. The pad oxide layer 314 includes a thickness ranging from about 2 to about 4 nm. In the present embodiment, the pad oxide layer 314 has a thickness of about 2 nm. The semiconductor device 300 further includes a cap layer 316 formed over the pad oxide layer. The cap layer 316 may be formed of silicon nitride. The cap layer 316 may be formed by CVD, PVD, ALD, or other suitable technique. The cap layer 316 includes a thickness ranging from about 10 to about 15 nm. In the present embodiment, the cap layer 316 has a thickness of about 10 nm. It should be noted that the pad oxide layer 314 may be omitted in some embodiments as will be explained later.

A patterned photoresist layer 320 is formed to protect the NMOS devices. The patterned photoresist layer 320 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint.

Figure 3B:
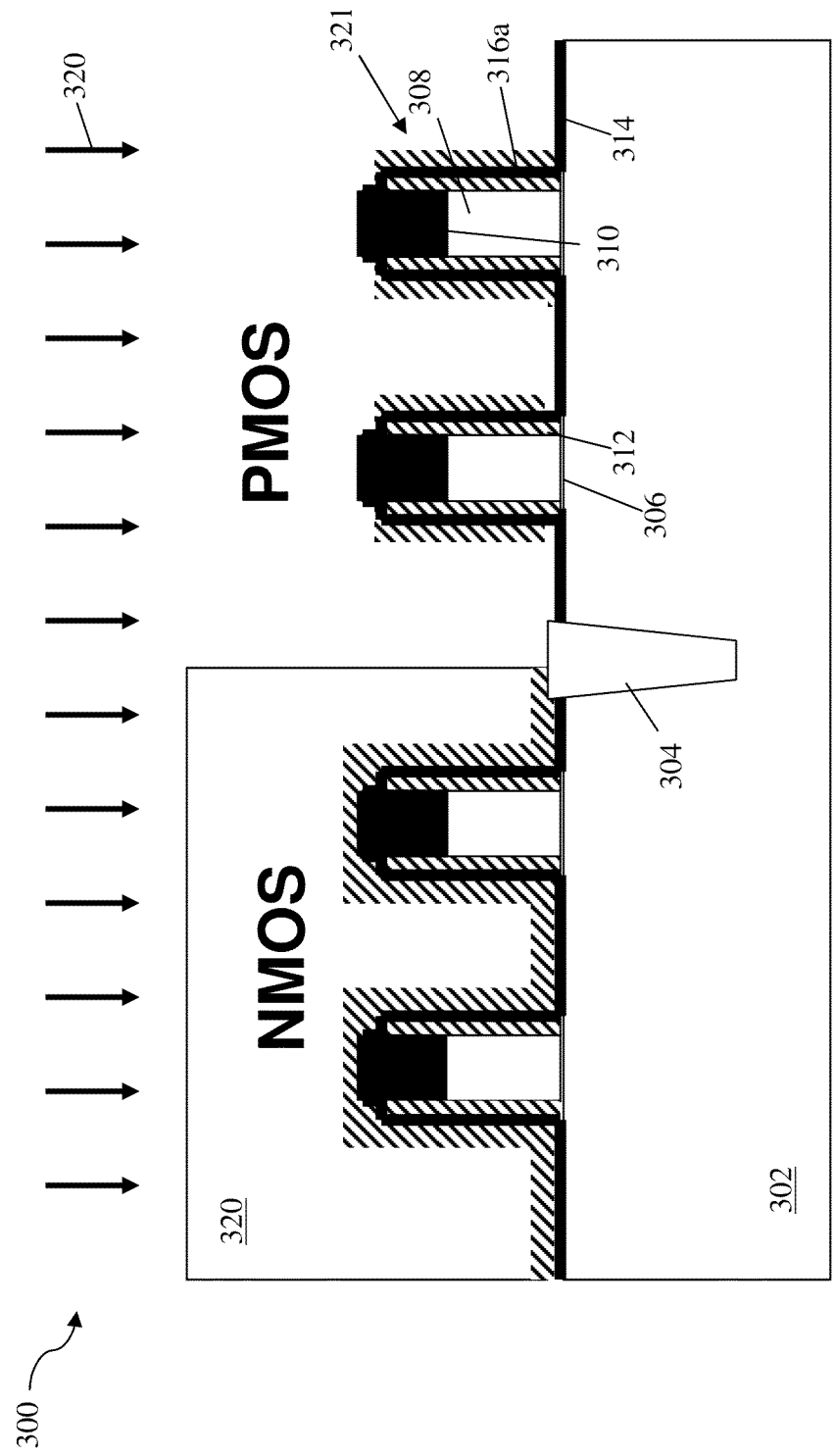

In FIG. 3B, an etching process 320 is performed to open the cap layer 316 directly overlying the substrate 302. In the present embodiment, the etching process 320 includes a dry etching process that utilizes a gas combination of CHxFy/O2 or SF6/CHxFy/He (where x=1 to 3 and y=4−x). With respect to the gas combination of CHxFy/O2, the dry etching process utilizes a pressure ranging from about 1 mT to about 1000 mT, a power ranging from about 500 W to about 3000 W, a bias voltage ranging from about 100 V to about 500 V, a CHxFy flow rate ranging from about 10 sccm to about 500 sccm, and an O2 flow rate ranging from about 10 sccm to about 500 sccm. With respect to the gas combination of SF6/CHxFy/He, the dry etching process utilizes a pressure ranging from about 1 mT to about 1000 mT, a power ranging from about 500 W to about 3000 W, a bias voltage ranging from about 50 V to about 200 V, a SF6 flow rate ranging from about 10 sccm to about 100 sccm, a CHxFy flow rate ranging from about 10 sccm to about 500 sccm, and an He flow rate ranging from about 10 sccm to about 1000 sccm. The dry etching process anisotropically etches the cap layer 316 such that a portion of the cap layer 316a remains on the sidewall of the gate structures. Accordingly, a dummy spacer 321 is formed that includes the offset spacer 312, the pad oxide 314, and the cap layer 316a. A thickness of the dummy spacer 321 can be controlled by tuning the dry etching process. The thickness of the dummy spacer 321 ranges from about 10 to about 20 nm. In the present embodiment, the thickness of the dummy spacer layer 321 is about 15 nm.

Figure 3C:
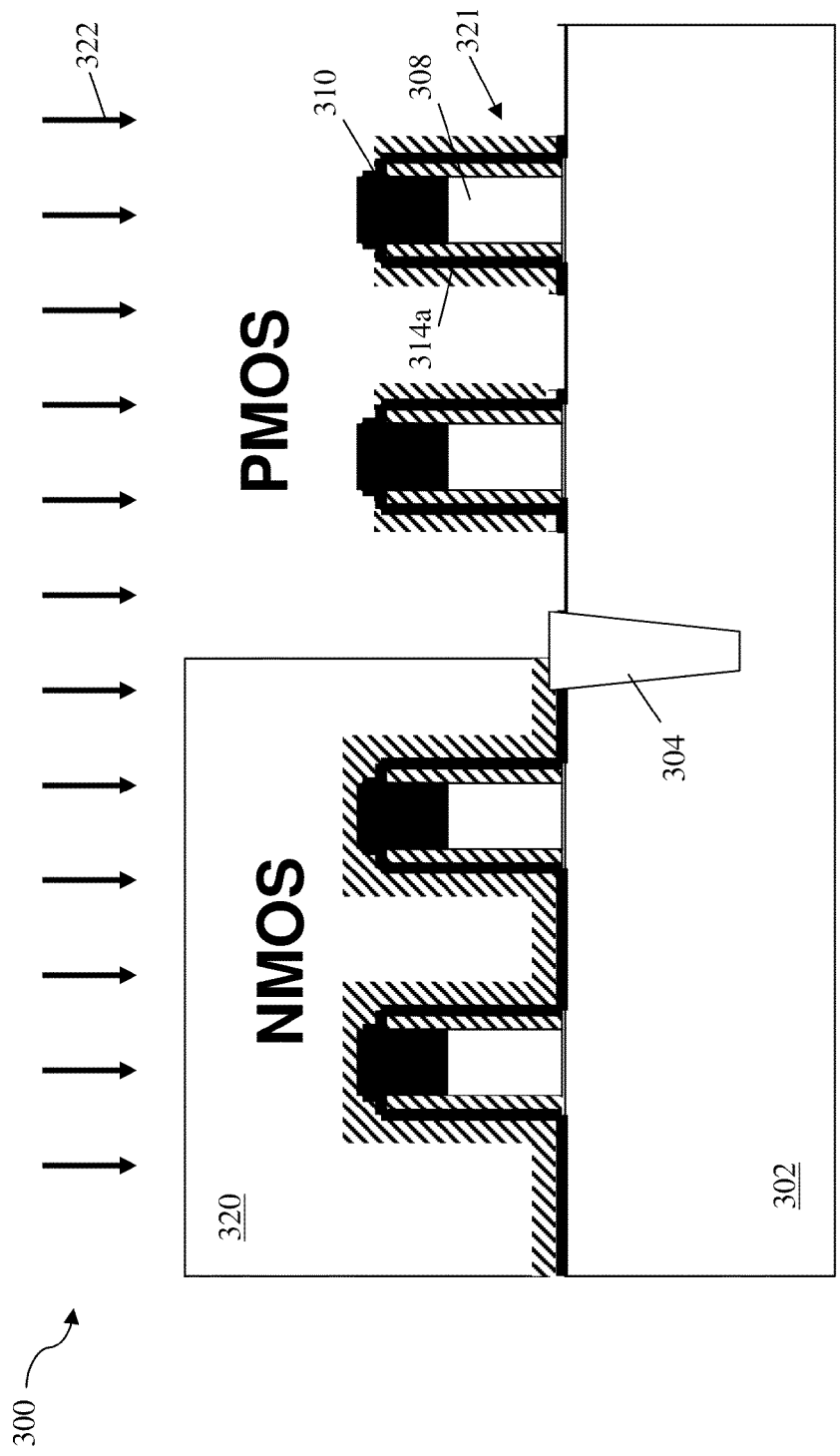

In FIG. 3C, an etching process 322 is performed to break through the pad oxide 314 directly overlying the substrate 302. The etching process 322 includes a dry etching process that utilizes a gas combination of CF4/Cl2/HBr/He, a pressure ranging from about 1 mT to about 1000 mT, a power ranging from about 50 W to about 500 W, a bias voltage ranging from about 10 V to about 500 V, a CF4 flow rate ranging from about 10 sccm to about 500 sccm, a Cl2 flow rate ranging from about 0 sccm to about 200 sccm, an HBr flow rate ranging from about 0 sccm to about 200 sccm, and an He flow rate ranging from about 0 sccm to about 1000 sccm. The dry etching removes portions of the pad oxide 314 overlying the substrate 302. The dry etching may be performed for about 9 seconds to break through the pad oxide. Following the dry etching, a portion of the pad oxide 314a that was protected by the cap layer 316a remains as part of the dummy spacer 321.

As previously noted, in some other embodiments, the pad oxide 314 may be omitted. Accordingly, the cap layer of silicon nitride is formed on the offset spacer. A dry etching may be performed to anisotropically etch the cap layer such that a portion of the cap layer directly overlying the substrate is removed but another portion of the cap layer remains on the offset spacer. The dry etching may be tuned such that the resulting dummy spacer of silicon nitride (e.g., cap layer and offset spacer) is about 15 nm thick (similar thickness when utilizing the pad oxide). In other embodiments, the resulting dummy spacer of silicon nitride may be thinner so that the recess can be formed closer to the channel region.

Figure 3D:
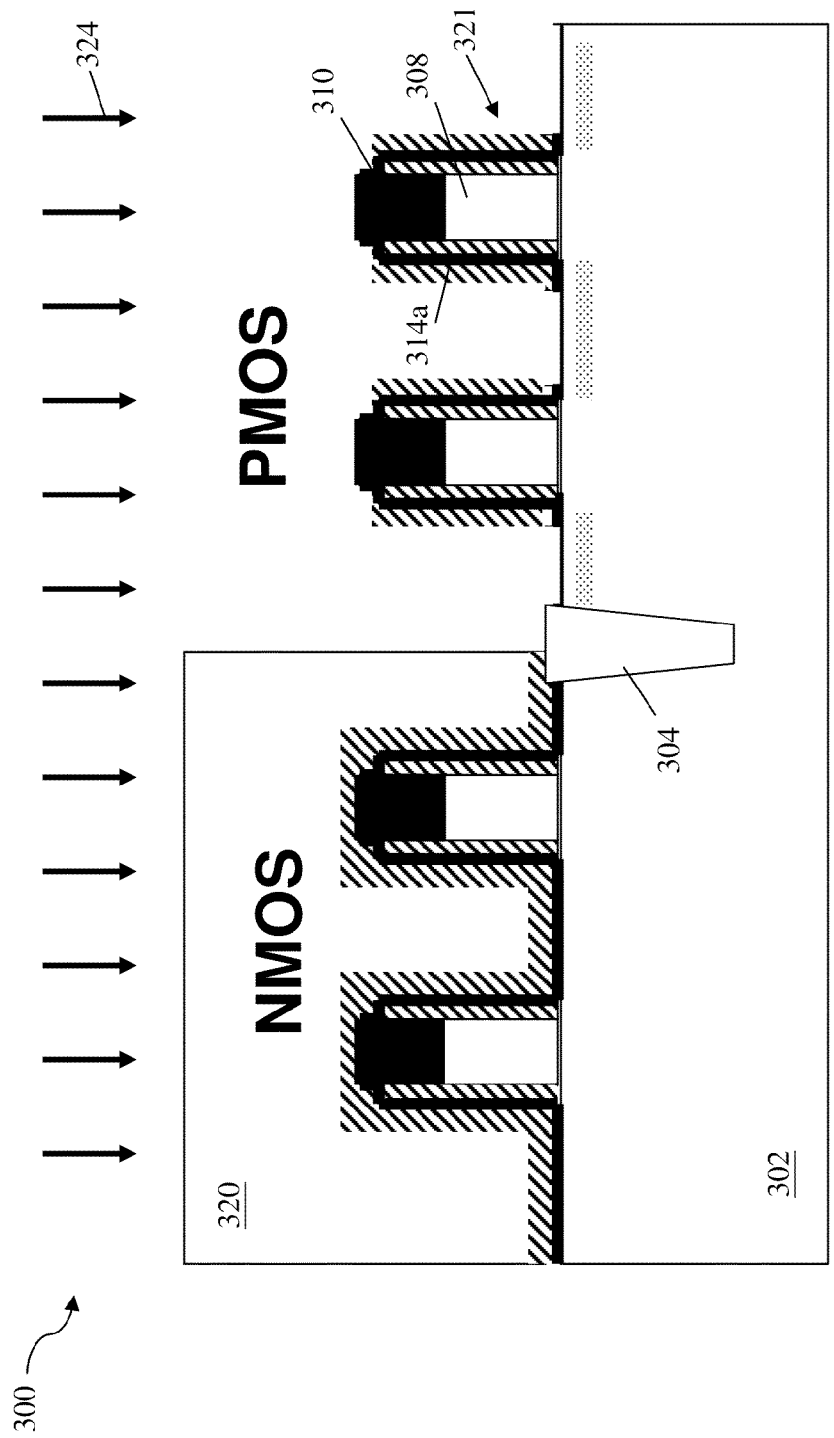

In FIG. 3D, an implant process 324 is performed to implant dopants into the substrate 302. In the present embodiment, the implant process 324 implants As or P with an energy ranging from about 10 KeV to about 50 KeV, a dosage ranging from about 1E12 atoms/cm$^2$ to about 1E14 atoms/cm$^2$, and a tilt angle ranging from about 10° to about 30°.

Figure 3E:
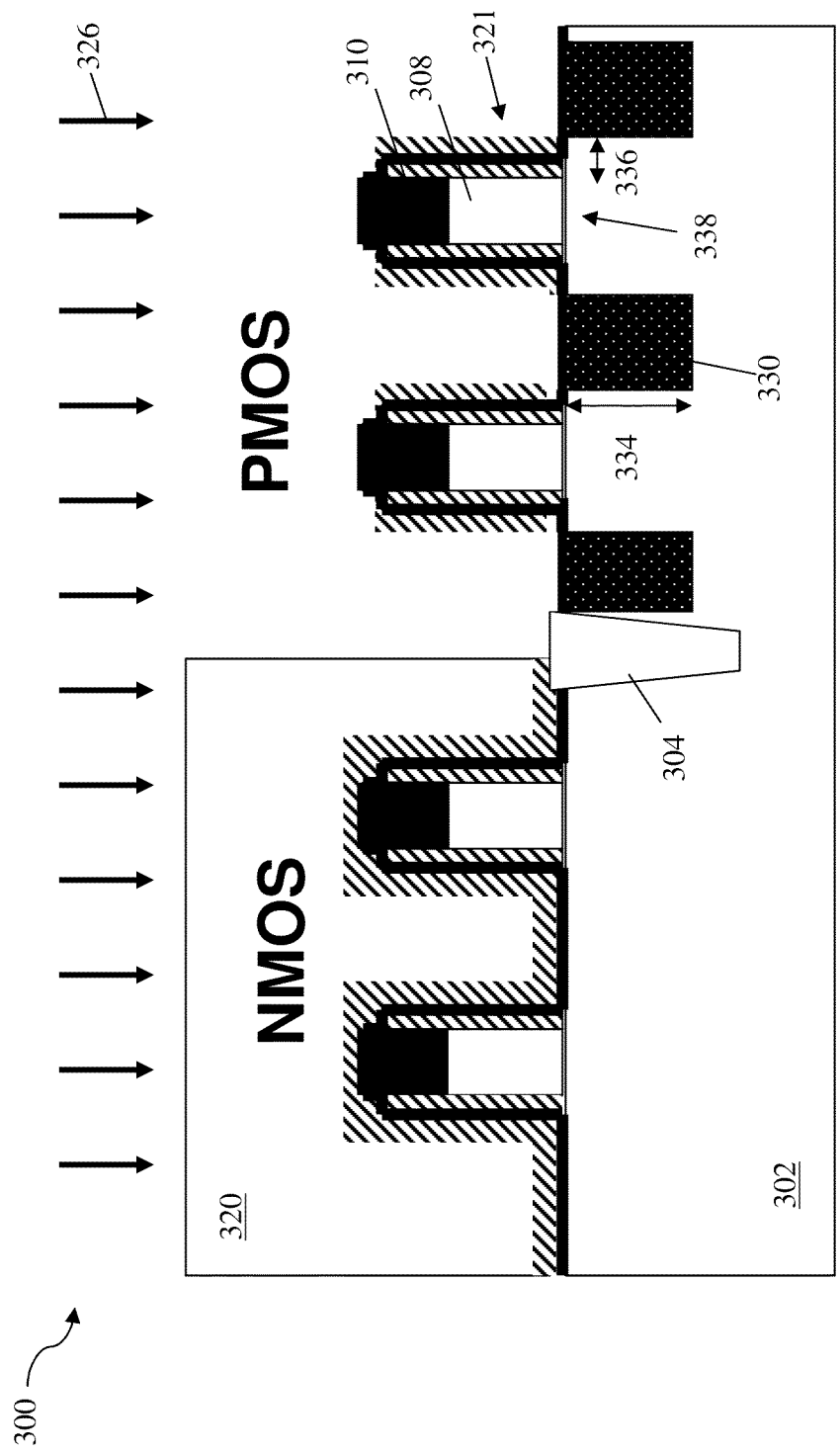

In FIG. 3E, an etching process 326 is performed to etch a recess 330 in the substrate 302. The etching process 326 includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate 302 that are unprotected or exposed. The dry etching process allows better control of an etching direction to achieve of a particular shape. Accordingly, the recess 330 has vertical sidewalls that are aligned with the dummy spacer 321 due to the directional/anisotropic etching. The recess 330 may have a depth 334 ranging from about 400 Angstrom to about 500 Angstrom. In the present embodiment, the recess has a depth 334 of about 450 Angstrom. Additionally, a proximity of the recess 330 to a channel region 338 may be limited by the thickness of the dummy spacer 321 disposed on the sidewall of the gate structure. In the present embodiment, the recess 330 is spaced a distance 336 of about 15 nm.

Figure 3F:
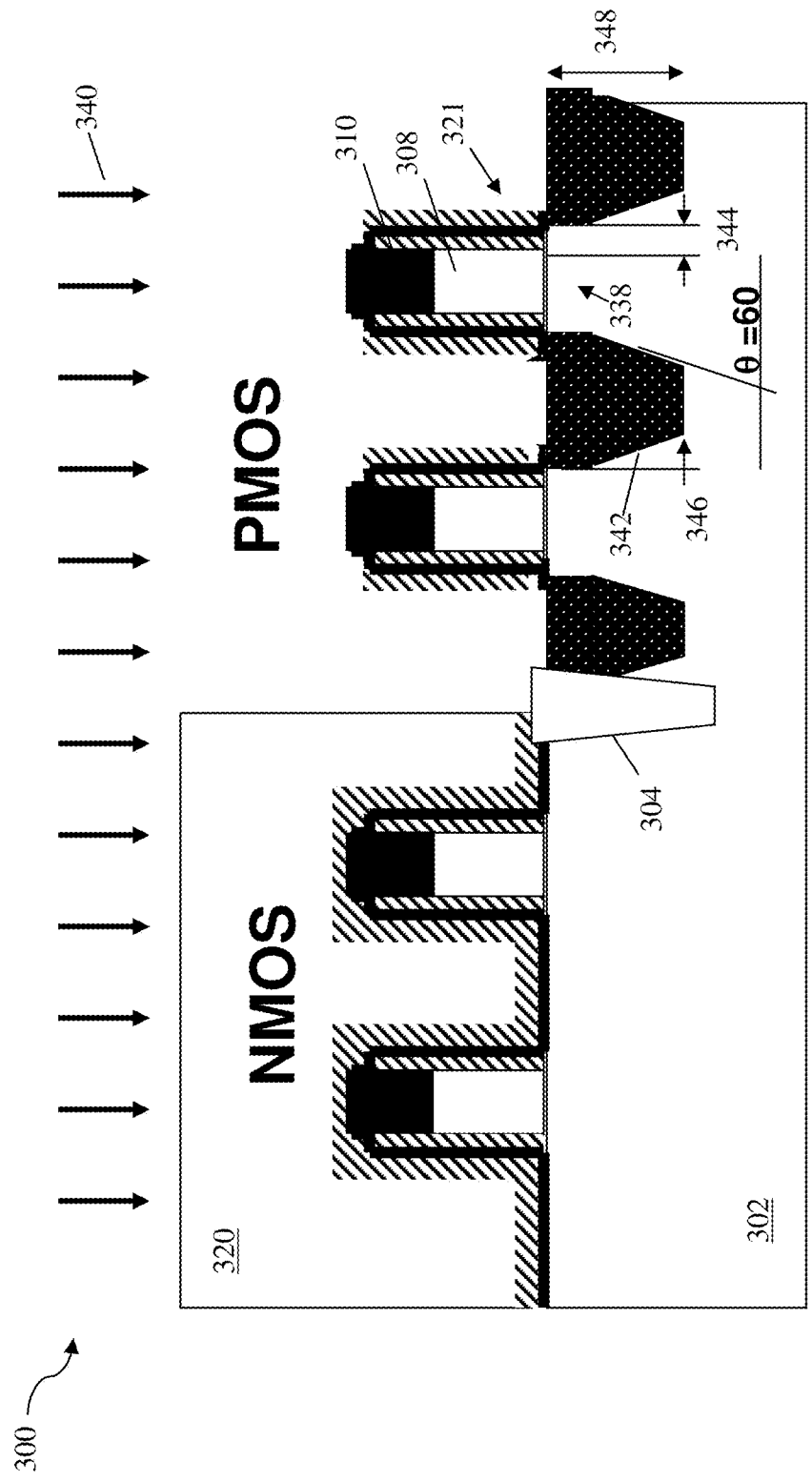

In FIG. 3F, an etching process 340 is performed to modify the recess 330 in the substrate 302. The etching process 340 includes a wet etching process that utilizes tetramethylammonium hydroxide (TMAH) solution or other suitable solution to expand the recess 330 such that it extends laterally directly under the dummy spacer 321. In another embodiment, the etching process 240 includes a thermal etching process that utilizes HCl gas with a high temperature ranging from about 600° C. to about 900° C. Accordingly, an extended recess 342 is formed that includes an upper portion that is spaced a distance 344 of about 1 nm to about 5 nm from the channel region 338 (or from a line that extends along the sidewall of the gate structure). Further, it has been observed that the TMAH solution exhibits different etch rates depending on which crystal plane is exposed, and thus a trapezoidal bottom portion of the recess 342 is formed. Accordingly, the recess 342 may include tapered sidewalls that have an angle θ ranging from about 50° to about 70°. In the present embodiment, the recess 342 includes sidewalls that are tapered at an angle θ of about 60°. It is noted that the angle θ is measured with respect to an axis that is parallel to the surface of the substrate 302. Additionally, the tapered portion of the recess 342 tapers a distance 346 of about 4 nm from the upper portion of recess. Further, the recess 342 includes an overall depth 348 ranging from about 500 Angstrom to about 600 Angstrom.

Figure 3G:
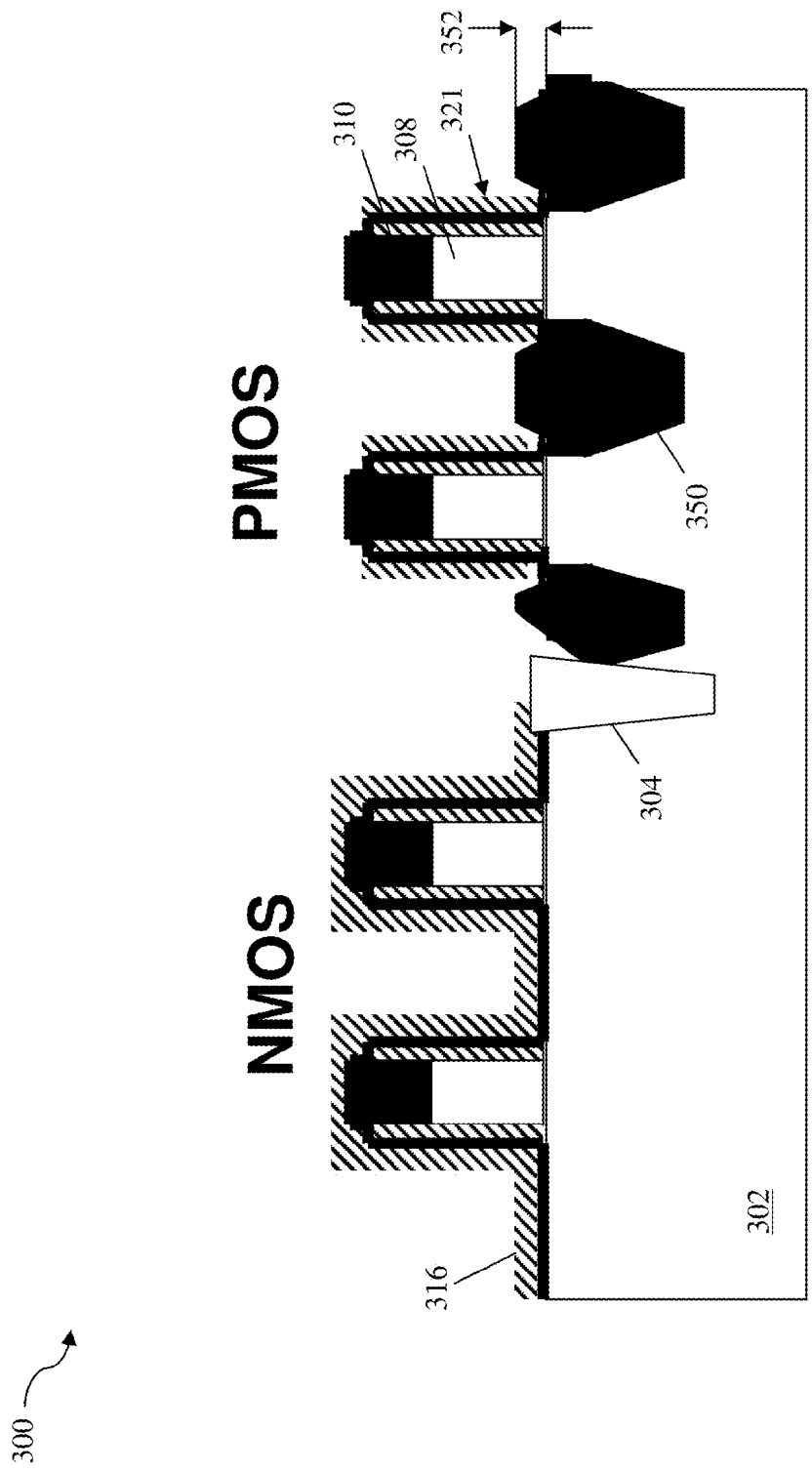

In FIG. 3G, an epitaxy process is performed to deposit a semiconductor material in the recess 342. The semiconductor material is different from the substrate. Accordingly, the channel region is strained or stressed to enable carrier mobility of the device and enhance the device performance. The patterned photoresist 320 protecting the NMOS devices is removed prior to the epi process. A pre-cleaning process may be performed to clean the recess 342 with HF or other suitable solution. In the present embodiment, silicon germanium (SiGe) 350 is deposited by an epitaxy (epi) process on the substrate 302 to form the source and drain regions. It is noted that the SiGe 350 does not accumulate on the hard mask 310, the dummy spacer 321, the cap layer 316, and the isolation structure 304. Additionally, the SiGe 350 is deposited such that it is raised a distance 352 of about 125 Angstrom above the surface of the substrate 302. In furtherance of the present embodiment, the SiGe 350 may be in-situ doped with p-type impurities, such as B or In, to form source/drain regions of the PMOS devices.

It has been observed that formation of the SiGe 350 structure in closer proximity to the channel region near the surface of the substrate provides more stress and strain, and thus carrier mobility is enhanced. Accordingly, a saturation drain current of the device can be improved by 10 to 20% over current techniques that form the strained structures. Further, the etching processes discussed above allow a better process margin to control the proximity of the SiGe 350 structure from the channel region. Additionally, the SiGe 350 structure does not suffer from short channel penalty such as drain induced barrier lowering (DIBL) due to SiGe proximity pull back (from the region of the substrate directly under the gate structure) with respect to the vertical and tapered sidewalls of the SiGe structure. This is even so even as device features shrink and the channel length becomes smaller in advanced technology processes (e.g., 32 nm and below).

Figure 3H:
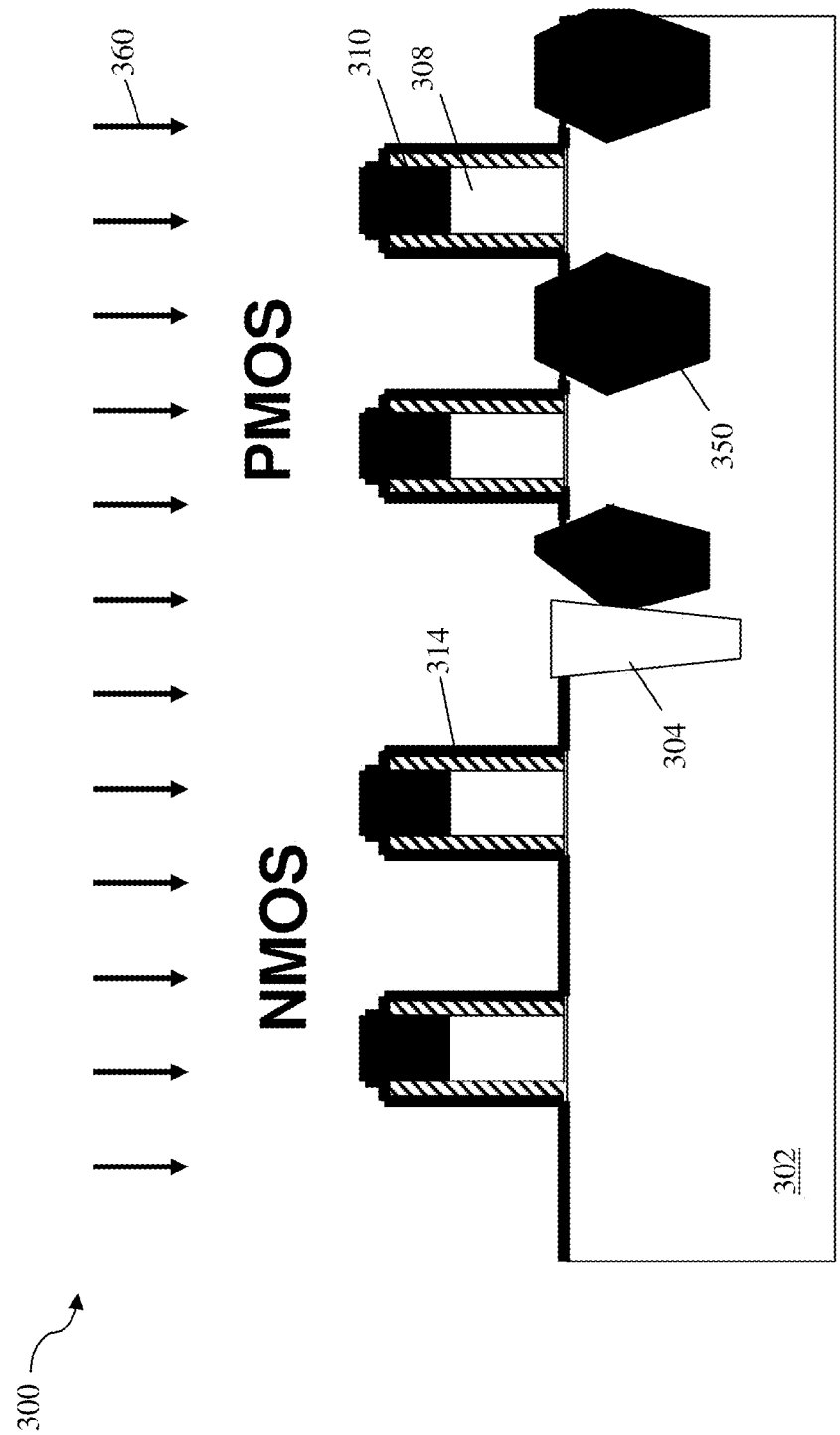

In FIG. 3H, an etching process 360 is performed to remove the cap layer 316 overlying the NMOS devices. The etching process 360 includes a wet etching utilizing H3PO4 or other suitable etchant. The wet etching is selected so that a slow etch rate is achieved to protect the poly. Additionally, the etching process 360 may remove the cap layer 316a of the dummy spacer 321. The semiconductor device 300 continues with processing to complete fabrication similar to the discussion above with reference to the semiconductor device 200 of FIG. 2.

In an embodiment, a method of fabricating a semiconductor device is provided. The method includes providing a semiconductor substrate; forming a gate structure on a surface of the substrate; forming a first material layer on each sidewall of the gate structure; forming a second material layer over the substrate and the gate structure including the first material layer; removing at least a portion of the second material layer overlying the semiconductor substrate at either side of the gate structure; performing a first dry etching to form an recess in the substrate; performing one of a second dry etching and a wet etching to modify the recess in the substrate, wherein the recess includes a portion that tapers in a direction away from the surface of the substrate; and filling the recess with a semiconductor material.

In another embodiment, a method of fabricating a semiconductor device is provided. The method includes providing a semiconductor substrate; forming a gate structure on a surface of the substrate; forming a first nitride layer on sidewalls of the gate structure; forming an oxide layer over the substrate and the gate structure including the first nitride layer; forming a second nitride layer over the oxide layer; removing a portion of the second nitride layer overlying the semiconductor substrate at either side of the gate structure; removing a portion of the oxide layer to expose the semiconductor substrate at either side of the gate structure; forming an recess by performing at least two etchings, wherein the recess includes an upper portion and a lower portion, the upper portion being proximate the surface of the substrate, the lower portion being tapered in a direction away from the surface of the substrate; and filling the recess with a semiconductor material different from the semiconductor substrate.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a semiconductor substrate;
a gate structure disposed on a surface of the semiconductor substrate;
spacers disposed on sidewalls of the gate structure, each spacer having an inner edge and an opposing an outer edge, the inner edge being closer to the gate structure than the outer edge; and
strained structures disposed in the semiconductor substrate at either side of the gate structure and formed of a semiconductor material different from the semiconductor substrate, each strained structure having a cross-sectional profile that includes a first portion that extends from the surface of the semiconductor substrate and a second portion that extends from the first portion at a first angle ranging from about 50° to about 70° and a third portion that extends from the surface of the semiconductor substrate and a fourth portion that extends from the third portion at a second angle ranging from about 50° to about 70°, the second portion directly opposing the fourth portion, wherein the first and second angles are measured with respect to an axis that is parallel to the surface of the substrate, wherein the first portion is aligned with the outer edge of one of the spacers.

2. The semiconductor device of claim 1, wherein the first portion is spaced a distance away from a line that extends along a sidewall of the gate structure, the distance ranging from about 1 nm to about 5 nm.

3. The semiconductor device of claim 1, wherein the second portion tapers away from the first portion by a distance of about 4 nm, the distance being measured in a direction parallel to the surface of the substrate.

4. The semiconductor device of claim 1, wherein the strained structures have a depth ranging from about 500 Angstrom to about 600 Angstrom.

5. The semiconductor device of claim 1, wherein the first angle is about 60°.

6. The semiconductor device of claim 1, wherein the strained structures are raised above the surface of the substrate.

7. The semiconductor device of claim 1, wherein the semiconductor material includes silicon germanium (SiGe).

8. The semiconductor device of claim 1, wherein the first portion is substantially parallel with respect to the third portion.

9. The semiconductor device of claim 1, wherein the first portion extends to a first depth within the substrate and the third portion extends to a second depth within the substrate, the first and second depths being substantially equal.

10. The semiconductor device of claim 1, wherein the second portion extends a first length from a first interface with the first portion to a second interface with a fifth portion of the cross-sectional profile for each strained structure and the fourth portion extends a second length from a third interface with the third portion to an fourth interface with the fifth portion, the first and seconds length being substantially equal.

11. The semiconductor device of claim 1, wherein each spacer includes an offset spacer layer and a pad oxide layer, the offset spacer layer and the pad oxide layer being formed of different materials.

12. A semiconductor device, comprising:
a semiconductor substrate having a surface;
a gate structure disposed on the surface of the semiconductor substrate;
a spacer disposed on a sidewall of the gate structure; and
a strained feature disposed in the semiconductor substrate and formed of a material different from the semiconductor substrate, the strained feature including a first vertical section that directly underlies the spacer and a first tapered section that tapers from the first vertical section in a direction away from the surface of the semiconductor substrate and a second vertical section that extends from the surface of the semiconductor substrate and a second tapered section that tapers from the second vertical section in a direction away from the surface of the semiconductor substrate and towards the first tapered section, the second vertical section directly opposing the first vertical section, wherein the first vertical section extends along a first plane and the sidewall of the gate structure extends along a second plane that is parallel to the first plane, the first and second planes being spaced apart from each other.

13. The semiconductor device of claim 12, wherein the first vertical section is spaced a distance away from an line that extends along the sidewall of the gate structure, the distance ranging from about 1 nm to about 5 nm.

14. The semiconductor device of claim 12, wherein the first tapered section is tapered at a first angle ranging from about 50° to about 70°, wherein the second tapered section is tapered at a second angle ranging from about 50° to about 70°, the first and second angles being measured with respect to an axis that is parallel to the surface of the substrate.

15. The semiconductor device of claim 14, wherein the first angle is about 60°.

16. The semiconductor device of claim 12, wherein the strained feature has a depth ranging from about 500 Angstrom to about 600 Angstrom.

17. The semiconductor device of claim 12, wherein the semiconductor material includes silicon germanium (SiGe).

18. A semiconductor device, comprising:
a semiconductor substrate having a first region and a second region;
an NMOS transistor disposed in the first region of the semiconductor substrate; and
a PMOS transistor disposed in the second region of the semiconductor substrate, the PMOS transistor including:
a gate structure disposed over a channel region of the semiconductor substrate;
spacers disposed on sidewalls of the gate structure; and
strained source and drain regions disposed in the semiconductor substrate at either side of the gate structure, the strained source and drain regions each having a first upper portion interfacing with a first lower portion that tapers away from the first upper portion at a first angle ranging from about 50° to about 70° and a second upper portion interfacing with a second lower portion that tapers away from the second upper portion at a second angle ranging from about 50° to about 70° and tapers toward the first lower portion, the first and second angles being measured with respect to an axis that is parallel to a surface of the semiconductor substrate.

19. The semiconductor device of claim 18, wherein the first and second lower portions extend substantially equally lengths to interface with a bottom portion, the bottom portion being substantially parallel with the surface of the semiconductor substrate.

\* \* \* \* \*